United States Patent
Khemka et al.

(10) Patent No.: US 7,608,908 B1
(45) Date of Patent: Oct. 27, 2009

(54) ROBUST DEEP TRENCH ISOLATION

(75) Inventors: Vishnu Khemka, Phoenix, AZ (US);
Amitava Bose, Tempe, AZ (US);
Michael C. Butner, Phoenix, AZ (US);
Bernhard H. Grote, Phoenix, AZ (US);
Tahir A. Khan, Tempe, AZ (US);
Shifeng Shen, Chandler, AZ (US);
Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 6 days.

(21) Appl. No.: 12/125,613

(22) Filed: May 22, 2008

(51) Int. Cl.
*H01L 29/00* (2006.01)
*H01L 29/167* (2006.01)

(52) U.S. Cl. .................... 257/510; 257/607; 257/E21.4; 257/E21.605

(58) Field of Classification Search ................ 257/510, 257/607, E21.4, E21.605
See application file for complete search history.

(56) References Cited

U.S. PATENT DOCUMENTS

| | | | |
|---|---|---|---|
| 5,436,179 | A | 7/1995 | Erdejac et al. |
| 6,110,797 | A | 8/2000 | Perry et al. |
| 6,399,449 | B1 | 6/2002 | Matsumoto |
| 6,734,524 | B1 | 5/2004 | Parthasarathy et al. |
| 6,888,196 | B2 * | 5/2005 | Kobayashi .................... 257/330 |
| 2002/0081809 | A1 | 6/2002 | Pinto et al. |
| 2005/0189585 | A1 * | 9/2005 | Jones .......................... 257/330 |
| 2006/0043474 | A1 * | 3/2006 | Kinzer et al. ................ 257/330 |
| 2008/0303081 | A1 * | 12/2008 | Hshieh ........................ 257/328 |

FOREIGN PATENT DOCUMENTS

EP 0949684 A2 10/1999

OTHER PUBLICATIONS

Kawai, F., et al., Multi-Voltage SOI-BiCDMOS for 14V and 42V Automotive Applications, Proceedings of 2004 International Symposium on Power Semiconductor Devices & ICs, Kitakyushu, pp. 165-168.

* cited by examiner

*Primary Examiner*—David S Blum
(74) *Attorney, Agent, or Firm*—Ingrassia, Fisher & Lorenz, P.C.

(57) ABSTRACT

Higher voltage device isolation structures (40, 60, 70, 80, 90, 90') are provided for semiconductor integrated circuits having strongly doped buried layers (24, 24"). One or more dielectric lined deep isolation trenches (27, 27', 27", 27''') separates adjacent device regions (411, 412; 611, 612; 711, 712; 811, 812; 911, 912). Electrical breakdown (BVdss) between the device regions (411, 412; 611, 612; 711, 712; 811, 812; 911, 912) and the oppositely doped substrate (22, 22") is found to occur preferentially where the buried layer (24, 24") intersects the dielectric sidewalls (273, 274; 273', 274'; 273", 274") of the trench (27, 27', 27", 27'''). The breakdown voltage (BVdss) is increased by providing a more lightly doped region (42, 42", 62, 72, 82) of the same conductivity type as the buried layer (24, 24"), underlying the buried layer (24, 24") at the trench sidewalls (273, 274; 273', 274'; 273", 274"). The more lightly doped region's (42, 42", 62, 72, 82) dopant concentration is desirably 1E4 to 2E2 times less than the buried layer (24, 24") and it extends substantially entirely beneath the buried layer (24, 24") or to a distance (724, 824) extending about 0.5 to 2.0 micro-meters from the trench sidewall (273, 274; 273', 274'; 273", 274"). In a preferred embodiment, the trench (27, 27') is split into two portions (271, 272; 271', 272') with the semiconductor therein (475, 675, 775, 875) ohmically coupled to the substrate (22).

20 Claims, 4 Drawing Sheets

US 7,608,908 B1

ROBUST DEEP TRENCH ISOLATION

FIELD OF THE INVENTION

The present invention generally relates to semiconductor (SC) devices and integrated circuits (ICs) and, more particularly, ICs where higher voltage inter-device isolation is needed.

BACKGROUND OF THE INVENTION

Modern electronic devices, especially semiconductor (SC) devices and integrated circuits (ICs) often employ multiple SC devices on the same semiconductor substrate or die. It is often desired to provide electrical isolation between the various SC devices on the same SC substrate. Dielectric lined trenches are often employed for this purpose. As the operating voltage and device density (devices per unit area) on the SC substrate increase it often becomes more difficult to maintain the desired device breakdown voltage. Further, there is often a tendency for the distribution of breakdown voltages observed across a die or wafer to widen with increased packing density, which can lead to lower manufacturing yields. Accordingly, there is an ongoing need to provide more robust isolation arrangements for SC devices and ICs.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
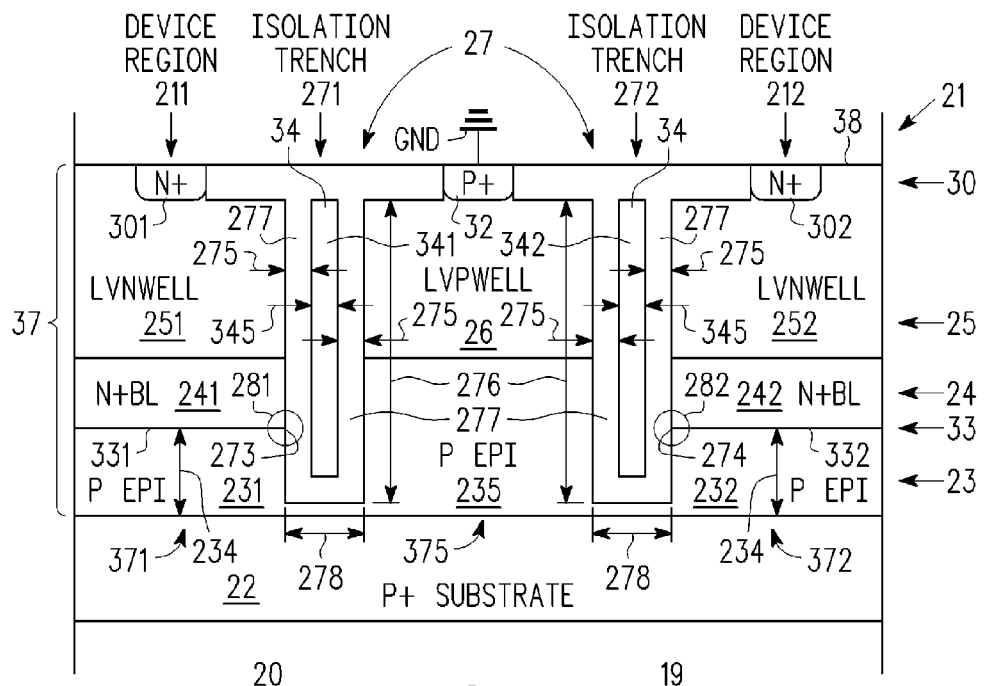
FIG. 1 is a simplified schematic cross-sectional view of an isolation wall between adjacent semiconductor device regions on the same SC substrate, utilizing two dielectric lined deep isolation trenches with floating poly-semiconductor cores, wherein the origin of premature device to substrate breakdown is identified.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. The term "poly-semiconductor" standing for a polycrystalline semiconductor or other conductive material whether semiconductor or not, is abbreviated as "poly-SC".

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second" opposite conductivity type", where the first conductivity type may be either N or P type and the second opposite conductivity type is then either P or N type, and so forth.

FIG. 1 shows simplified schematic cross-sectional view 19 of isolation wall 20 between adjacent semiconductor device regions 211, 212 (collectively 21) on the same SC substrate or die substrate 22, utilizing two dielectric lined deep isolation trenches 271, 272 (collectively 27) with floating poly-SC cores 341, 342 (collectively 34). Floating poly-SC cores 34 have lateral thickness 345 of about 0.5 micro-meters, but larger or smaller thicknesses can also be used. Dielectric liners 277 on sidewalls 273, 274 of trenches 271, 272 have thickness desirably in the range of about 0.4 to 0.6 micro-meters with about 0.5 micro-meters being preferred. P EPI layer 23 overlies P+ substrate 22. P EPI layer 23 has three regions; P EPI region 231 associated with device region 211, P EPI region 232 associated with device region 212, and P EPI region 235 lying between dielectric lined deep trenches 271, 272. N+ buried layer (N+BL) 24 has region 241 overlying P EPI region 231 and region 242 overlying P EPI region 232 located, respectively, in device regions 211, 212. Moderately doped N WELL regions 251, 252 (collectively 25) overlie N+BL regions 241, 242 respectively. Regions 251, 252 are commonly referred to in the art as "LOW VOLTAGE N WELLS", abbreviated as "LVNWELL" as shown in the various drawings. N+ contact regions 301, 302 (collectively 30) are provided in LVNWELLS 251, 252, respectively. Moderately doped P region 26 (identified as LVPWELL region 26 in the drawings), overlies P-EPI region 235 between dielectric lined deep trenches 271, 272. P+ contact region 32 is provided to LVPWELL region 26. P+ SUBSTRATE 22 conveniently has doping in the range of about 1E18 to 5E18 atoms/cc, P EPI region 23 conveniently has doping in the range of about 1E15 to 5E15 atoms/cc, N+BL 24 conveniently has doping in the range of about 1E19 to 1E20 atoms/cc, LVNWELL 25 conveniently has doping in the range of about 1E17 to 5E17 atoms/cc, LVPWELL 26 conveniently has doping in the range of about 1E17 to 5E17 atoms/cc and N+ and P+ contact regions 301, 302 and 32 respectively are conventional highly doped contacts. The origin of premature breakdown is found to be occurring in regions 281, 282 adjacent deep isolation trenches 271, 272 (collectively 27) about where junctions 331, 332 between P EPI regions 231, 232 and N+BL regions 241, 242 intersect sidewalls 273, 274 of deep isolation trenches 27.

Structure 20 of FIG. 1 and analogous portions of structures 40, 60, 70, 80, 90, 90' of FIGS. 2, 4, 5, 6, 7 and 8 are created by epitaxially forming further SC layer 37, 47, 67, 77, 87, 97 e.g., a P EPI layer, on P+ substrate 22. The lower portion of this further SC layer 37, 47, 67, 77, 87, 97 provides P EPI region 23 in FIG. 1 and P-EPI regions 44, 64, 74, 84, 44" in FIGS. 2 and 4-8. The upper portions of this further SC layer 37, 47, 67, 77, 87, 97 are doped, e.g., by ion implantation, to provide LVNWELL 25 in FIGS. 2 and 4-8 and LVPWELL 26 in FIGS. 2 and 4-6. N+BL 24, 24" within this further SC layer 37, 47, 67, 77, 87, 97 is generally provided by ion implantation so as to be located at the interface between LVNWELL 25, 25" and P EPI region 23 in FIG. 1 and P EPI regions 44, 64, 74, 84, 44" in FIGS. 2 and 4-8 outside of dielectric lined deep trenches 27, 27', 27". The depth of the implanted regions is determined by their implant energy according to means well known in the art. Deep dielectric lined trenches 27, 27', 27" are conveniently formed by masking and etching after formation of the P EPI layer and by oxidation of the sidewalls thereof or by dielectric deposition to fill the trenches followed by planarization to remove the excess dielectric. In those embodiments (e.g., see FIGS. 1, 2 and 8) wherein a floating poly-SC core (e.g., polysilicon) is provided, deposition of the poly-SC core and oxidation or dielectric coating of the trench sidewalls is conveniently accomplished by standard deposition techniques well known in the art. Either arrangement is useful. Dielectric lined deep trenches 27, 27' may be provided before, during or after formation of LVNWELL regions 25 and N+BL regions 24, 24' of FIGS. 1-2 and 4-8 and before or after formation of additional LVPWELL region 26 in FIGS. 1-2 and 4-6. Either sequence is useful. Contact regions 30, 32 are provided in LVNWELL regions 25 and LVPWELL region 26 where present, respectively, by thermal doping, ion implantation or other convenient means. Appropriate masks 102, 104 (see FIGS. 2 and 3-6) of photoresist, oxide, nitride, other masking materials or combinations thereof may be used to laterally define the various regions 20, 40, 60, 70, 80, 90 of FIGS. 1, 2 and 4-6. A blanket implant may be used for the structures of FIGS. 7-8. The details of the devices located in device regions 21, 41, 61, 71, 81, 91 have been omitted in the various drawings, since these details are not important to the present invention. When one or both of device regions 21, 41, 61, 71, 81, 91 of FIGS. 1-2 and 4-8 are energized, P+ contact region 32 and/or substrate 22 or both are usually coupled to the reference potential, denoted here as "ground" (GND) even though it may not have an earth connection. In either case P+ substrate 22 is tied to GND (the reference potential). What is of concern is the breakdown voltage between N+BL buried layer region 24, 24" of device regions 21, 41, 61, 71, 81, 91 and substrate 22. This breakdown voltage is denoted as BVdss. While in the accompany drawings, buried layer 24, 24" is denoted as N+ and substrate 22 is denoted as P+, this is merely for convenience of explanation and not intended to be limiting, and where opposite conductivity type devices are desired, buried layer 24, 24" may be P+ and the substrate 22 may be N+, or as noted earlier, these regions may be described as being of a "first conductivity type" and a "second opposite conductivity type" where "first" refers to either N or P type and "second, opposite," then refers to P or N type, respectively.

Referring again to FIG. 1, BVdss occurs across PN junctions 331, 332 (collectively 33) between N+BL 24 and P EPI region 23. It has been found that when device regions 211, 212 are energized to a high voltage, "high" referring to the magnitude of the voltage and not the polarity, that the electrical breakdown between N+BL 24 and P+SUBSTRATE 22 occurs in regions 281, 282 where P-N junctions 331, 332 (collectively 33) intersect sidewalls 273, 274 of dielectric lined deep isolation trenches 271, 272 (collectively 27). It is further found that the magnitude of the N+BL 24 to P+SUBSTRATE 22 breakdown voltage (i.e., BVdss) is significantly less than what would be expected based on the dopant density of the various regions and thickness 234 of P EPI region 23. In addition, it is found that the mean breakdown voltage (MEAN BVdss) and standard deviation (STD DEV) of the breakdown voltage are significantly degraded as the density (number per unit area) of isolation walls 20 increases, that is, as more and more isolated devices are packed into the same die area. It has been found that the degradation of the mean breakdown voltage (MEAN BVdss) and the widening of the standard deviation (STD DEV) of the breakdown voltage arise due to the presence of very high electric fields in regions 281, 282 where junctions 331, 332 meet sidewalls 273, 274 of dielectric lined deep isolation trenches 271, 272. The electric fields in regions 281, 282 can be several times higher than the fields across junctions 331, 332 at locations remote from sidewalls 273, 274 of dielectric lined deep isolation trenches 271, 272, thereby explaining why the observed breakdown is significantly less than what would be expected for planar junctions 331, 332 where they do not intersect sidewalls 273, 274 of trenches 27. These problems can be alleviated by employing the structures illustrated in FIGS. 2 and 4-8.

Figure 2:
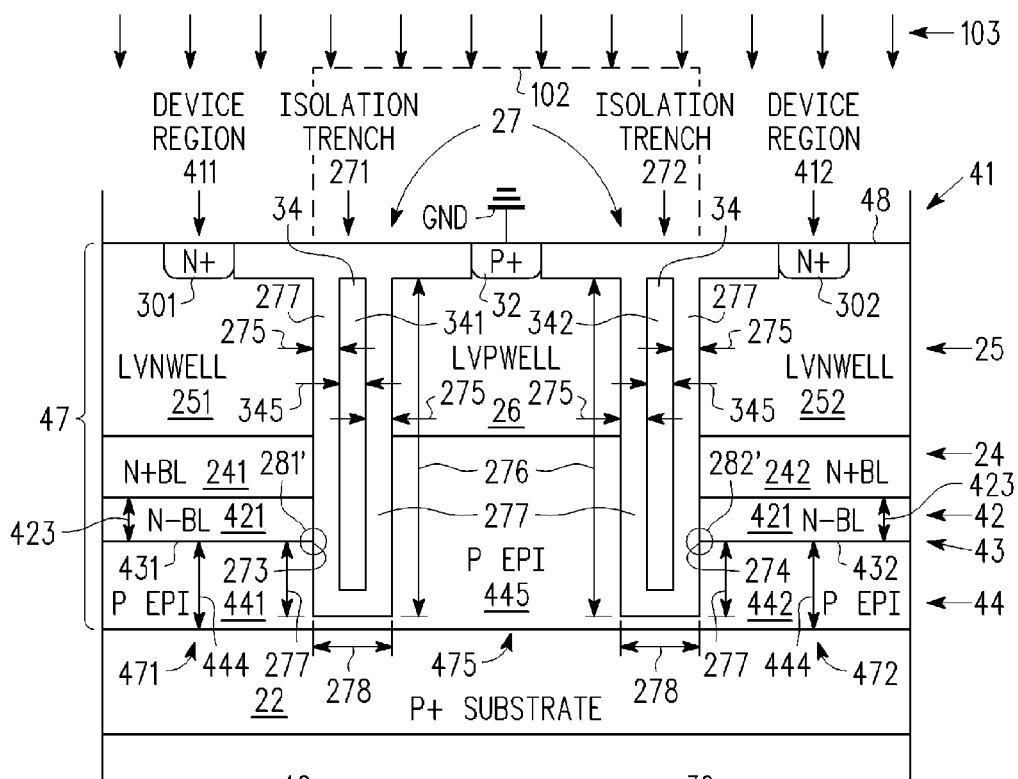
FIG. 2 is a simplified schematic cross-sectional view, similar to that of FIG. 1, of an isolation wall between adjacent semiconductor device regions on the same SC substrate, utilizing two dielectric lined deep isolation trenches with floating poly-semiconductor cores, but according to an embodiment of the invention.

In the example of FIG. 1 and also in the embodiments of FIGS. 2 and 4-6, isolation walls 20, 40, 60, 70, 80 are shown as employing dielectric lined deep isolation trenches 27, 27' having two portions, left portion 271, 271' adjacent left device region 411, 611, 711, 811 and right portion 272, 272' adjacent right device region 412, 612, 712, 812, with part 375, 475, 675, 775, 875 of further SC layer 37, 47, 67, 77, 87 therebetween. Parts 371, 471, 671, 771, 871, 971 of further SC layers 37, 47, 67, 77, 87, 97 accommodate device regions 411, 611, 711, 811, 911 and parts 372, 472, 672, 772, 872, 972 of further SC layers 37, 47, 67, 77, 87, 97 accommodate device regions 412, 612, 712, 812, 912. In these examples, parts 375, 475, 675, 775, 875 of further SC layer 37, 47, 67, 77, 87 lying between portions 271, 272 or 271', 272' comprise portions 26, 235 of part 375 of further SC layer 37 lying between portions 271, 272 in FIG. 1, portions 26; 445 of part 475 of further SC layer 47 lying between portions 271, 272 in FIG. 2, portions 26, 645 of part 675 of further SC layer 67 lying between portions 271', 272' in FIG. 4, portions 26, 745 of part 775 of further SC layer 77 lying between portions 271', 272' in FIG. 5 and portions 26, 845 of part 875 of further SC layer 87 lying between portions 271', 272' in FIG. 6. However, this is not essential and portions 271, 272 or 271', 272' may be combined into single dielectric lined deep isolation trench 27" (see FIGS. 7-8) and the further parts 375, 475, 675, 775, 875 of SC layer 37, 47, 67, 77, 87 lying between portions 271, 272 or 271', 272' omitted. For convenience of description and not intended to be limiting, FIG. 1 and the embodiments of FIGS. 2 and 4-6 illustrate structures employing trench 27, 27' with two portions 271, 272 or 271', 272' per isolation wall 20, 40, 60, 70, 80 and intervening parts 375, 475, 675, 775, 875 of further SC layer 37, 47, 67, 77, 87 noted above lying therebetween. When included, further parts 375, 475, 675, 775, 875 of SC layer 37, 47, 67, 77, 87 noted above lying between trench portions 271, 272 or 271', 272' are desirably of the same conductivity type and ohmically coupled to substrate 22. This enhances the isolation and is preferred. However, persons of skill in the art will understand based on the description herein that the intervening parts 375, 475, 675, 775, 875 of further SC layer 37, 47, 67, 77, 87 noted above may be omitted as shown in FIGS. 7-8, and left device region 211, 411, 611, 711, 811 and right device region 212, 412, 612, 712, 812 separated by single dielectric lined deep isolation trench 27", wherein portions 271, 272 or 271', 272' are combined. Further, while inclusion of poly-SC core 34 in FIGS. 1-2 is desirable for manufacturing convenience, it is not essential and may be omitted or included. By way of example and not intended to be limiting, poly-SC core 34, 34" is shown in isolation walls 27 and 27''' of FIGS. 1-2 and 8 and omitted in isolation walls 27' of FIGS. 4-6, but may be included or omitted in any or all of the examples presented herein. As user herein, the words "dielectric lined trench", "dielectric isolation wall", and "dielectric lining" in reference to a trench or isolation wall, are intended to refer to any trench or isolation wall configuration where the interior sides of the trench or isolation wall have a dielectric material thereon, as for example and not intended to be limiting: (i) a configuration where a core of a non-dielectric material is present in the trench, such as is illustrated in FIGS. 1, 2 and 8, no matter whether such core extends to the upper surface or not; (ii) a configuration where the trench is completely filled with a dielectric material without a core, such as is illustrated in FIGS. 4, 5, 6 and 7; (iii) and a configuration where a central region of the trench is empty but a dielectric covers the interior walls of the trench, such as would result if cores 34, 34" of FIGS. 1,2 and 8 were missing and the space left behind was unfilled, no matter whether such space extended to the upper surface or not.

FIG. 2 shows simplified schematic cross-sectional view 39, similar to that of FIG. 1, of isolation wall 40 between adjacent semiconductor device regions 411, 412 (collectively 41) on SC substrate 22, utilizing two dielectric lined deep isolation trenches 271, 271 (collectively 27) with poly-SC cores 34, but according to an embodiment of the invention. Device regions 411, 412 of FIG. 2 are analogous to device regions 211, 212 of FIG. 1. The same reference numbers are used in FIGS. 2 and 4-8 as in FIG. 1 to refer to analogous regions, and the foregoing discussion of such regions is incorporated by reference herein and in connection with FIGS. 4-8. Poly-SC cores 34 are conveniently of polysilicon but other conductive materials can also be used. The poly-SC cores can be as-deposited undoped or suitably doped with any conductivity type depending on the utilization of this layer in other devices on the IC. Isolation wall 40 and device regions 41 of FIG. 2 differ from isolation wall 20 and device regions 21 of FIG. 1 by the inclusion in the structure of FIG. 2, a more lightly doped N− buried layer (N+BL) 42 between N+BL 24 and P EPI region 44. P-EPI region 44 is analogous to P EPI region 23. This has the effect of moving higher field regions 281', 282' to junction 431, 432 (collectively 43) between N−BL 42 and P EPI region 44 where, because of the lower doping level of N−BL 42, the electric field is correspondingly reduced, the breakdown voltage increased and the standard deviation narrowed.

P+ SUBSTRATE 22 conveniently has doping in the range of about 1E18 to 5E18 atoms/cc, P EPI region 44 conveniently has doping in the range of about 1E15 to about 5E15 atoms/cc, N−BL 42 conveniently has doping in the range of about 1E16 to 5E16 atoms/cc and a thickness 423 usefully in the range of about 0.2 to 2.0 micro-meters, more conveniently in the range of about 0.3 to about 0.7 micro-meters and preferably about 0.5 micro-meters, N+BL 24 conveniently has doping in the range of about 1E19 to about 1E20 atoms/cc and a thickness conveniently in the range of about 1.5 to 2.0 micro-meters although thinner and thicker layers can also be used. LVNWELL 25 conveniently has doping in the range of about 1E17 to 5E17 atoms/cc, LVPWELL 26 conveniently has doping in the range of about 1E17 to 5E17 atoms/cc and N+ and P+ contact regions 301, 302 and 32 respectively are conventional highly doped contacts. Stated another way, N−BL 42, 62, 72, 82, 42" has a doping concentration $C_{(N-BL)}$ in atoms/cc intermediate between the doping concentration $C_{(N+BL)}$ in atoms/cc of N+BL 24, 24" and the doping concentration $C_{(P-EPI)}$ in atoms/cc of P EPI region 44, 64, 74, 84, 44". The ratio $C_{(N+BL)}/C_{(N-BL)}$ is usefully in the range of about 2E2 to 1E4, conveniently in the range of about 5E2 to 5E3 and preferably about 1E3 to 2E3. The ratio $C_{(N-BL)}/C_{(P-EPI)}$ is desirably in the range of about 5E0 to 5E1 and preferably about 1E1. These same concentration ranges and ratios apply to N−BL regions or layers 24, 24", N−BL regions or layers 42, 62, 72, 82, 42" and P EPI layers or regions 44, 64, 74, 84, 44" of FIGS. 2 and 4-8. It is desirable that dielectric lined deep trenches 27, 27', 27" extend below N−BL 42 of FIG. 2 (and below N−BLs 62, 72, 82, 42" of FIGS. 4-8) by a distance 277 greater than zero micro-meters, and more conveniently at least about 0.25 micro-meters and preferably at least about 0.5 micro-meters.

Figure 3:
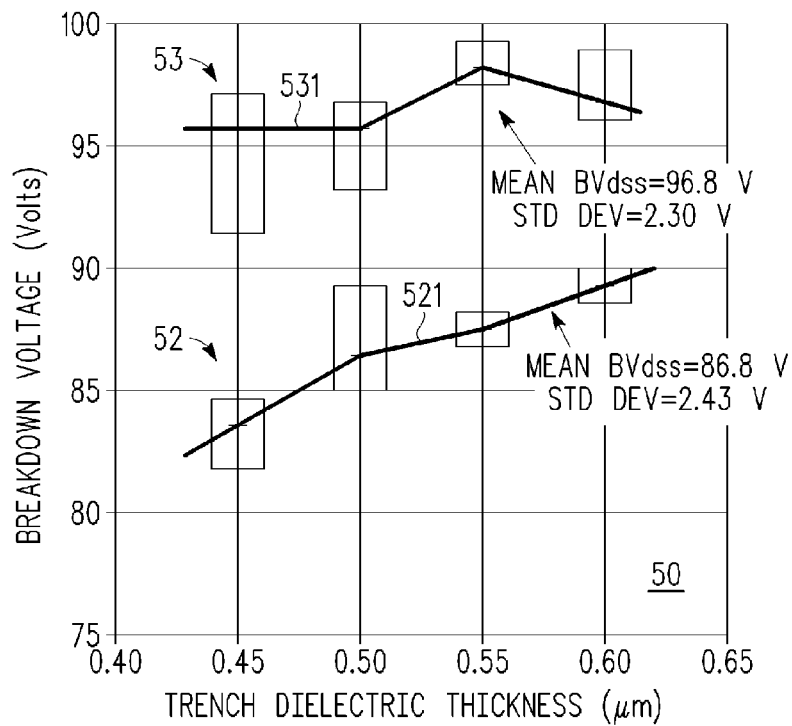
FIG. 3 is a simplified plot of breakdown voltage as a function of trench dielectric thickness for the structure of FIG. 1 and the structure of FIG. 2.

FIG. 3 shows simplified plot 50 of breakdown voltage BVdss in volts (V) as a function of thickness 275 in micro-meters (μm) of dielectric sidewalls 277 of dielectric lined deep trenches 27 for the structure of FIG. 1 (data 52 and trace 521) and the structure of FIG. 2 (data 53 and trace 531). The rectangular boxes on FIG. 3 indicate the BVdss spreads for each thickness 275 in the range of 0.45 to 0.60 micro-meters and solid traces 521, 531 are drawn through the mean values of the data for each dielectric thickness value. For each dielectric thickness 275, data was taken for three different trench depths 276 of 7.5, 8.0 and 8.5 micro-meters. It will be noted that for the structure of FIG. 1, data 52 and trace 521 of FIG. 3 show that BVdss was consistently below 90 volts, with a mean value of BVdss of 86.8 volts and a standard deviation (STD DEV) of 2.43 volts. For the structure of FIG. 2, data 53 and trace 531 of FIG. 3 show that BVdss was consistently higher than the values observed for data 52 and trace 521 for FIG. 1. Data 53 for the structure of FIG. 2 yield a mean value of BVdss of 96.8 volts and a standard deviation of 2.3 volts. The percent increase of mean BVdss given by (96.8–86.8)/86.8=11.5% is a very significant improvement. The percent improvement (i.e., decrease) in standard deviation (STD DEV) given by (2.30–2.43)/2.43=–5.3% is also helpful in reducing manufacturing yield loss due to variations in BVdss across the die or wafer. While the arrangement illustrated in FIG. 2 is preferred, other arrangements for reducing the electric field concentration at sidewalls 273, 274 of dielectric lined deep trenches 271, 272 are also useful. These further embodiments are illustrated in FIGS. 4-8.

Figure 4:
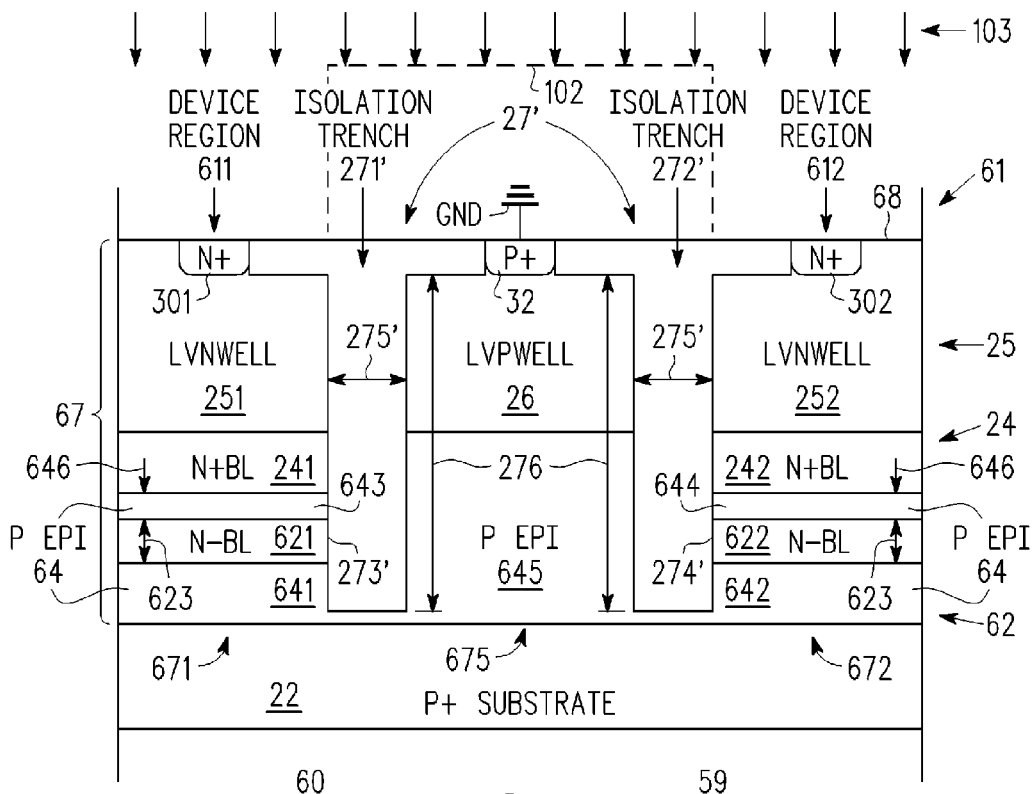
FIG. 4 is a simplified schematic cross-sectional view, analogous to that of FIG. 2, of an isolation wall between adjacent semiconductor device regions on the same SC substrate, utilizing two dielectric lined deep isolation trenches without poly-semiconductor cores, but according to a still further embodiment of the invention.

FIG. 4 shows simplified schematic cross-sectional view 59, similar to that of FIG. 2, of isolation wall 60 between adjacent semiconductor device regions 611, 612 (collectively 61) on SC substrate 22, utilizing two dielectric lined deep isolation trenches 271', 272' (collectively 27'), but according to a still further embodiment of the invention. In embodiments 60, 60, 80 of FIGS. 4-6, poly-SC cores 34 of FIGS. 1-2 and 8 are omitted, but this is not essential. N+BL 24, LVWELLS 25, 26 and contact regions 301, 302 and 32 are substantially the same as in FIGS. 1 and 2. Structure 60 of FIG. 4 differs from structure 40 of FIG. 2 in that N–BL 62 of FIG. 4 (analogous to N–BL 42 of FIG. 2) is not in direct contact with N+BL 42. N–BL 62 has portion 621 associated with device region 611 and portion 622 associated with device region 612. P EPI region 64 of FIG. 4 (analogous to P EPI region 44 of FIG. 2) has portions 641, 643 associated with device region 611 and portions 642, 644 associated with device region 612, where N–BL portion 621 lies between P EPI layer portions 641 and 643 and N–BL portion 622 lies between P EPI layer portions 642 and 644. N–BL 62 and P EPI layer 64 desirably have doping levels substantially the same as N–BL 42 and P EPI layer 44 of FIG. 2. Separation distance 646 between N–BL 62 and N+BL 24 is desirably such that regions or portions 643, 644 fully deplete before the breakdown voltage is reached. This has the effect of causing N+BL 24 and N–BL 62 to electrically merge so that the combined action is similar to that of the structure of FIG. 2, where N+BL region 24 and analogous N–BL region 42 are in contact. The applied voltage is spread across a greater extent of N–BL 62 and P EPI region 64, thereby decreasing the peak electric field at sidewalls 273, 274 of dielectric lined deep trenches 271', 272' so that BVdss is improved compared to that of FIG. 1.

Figure 5:
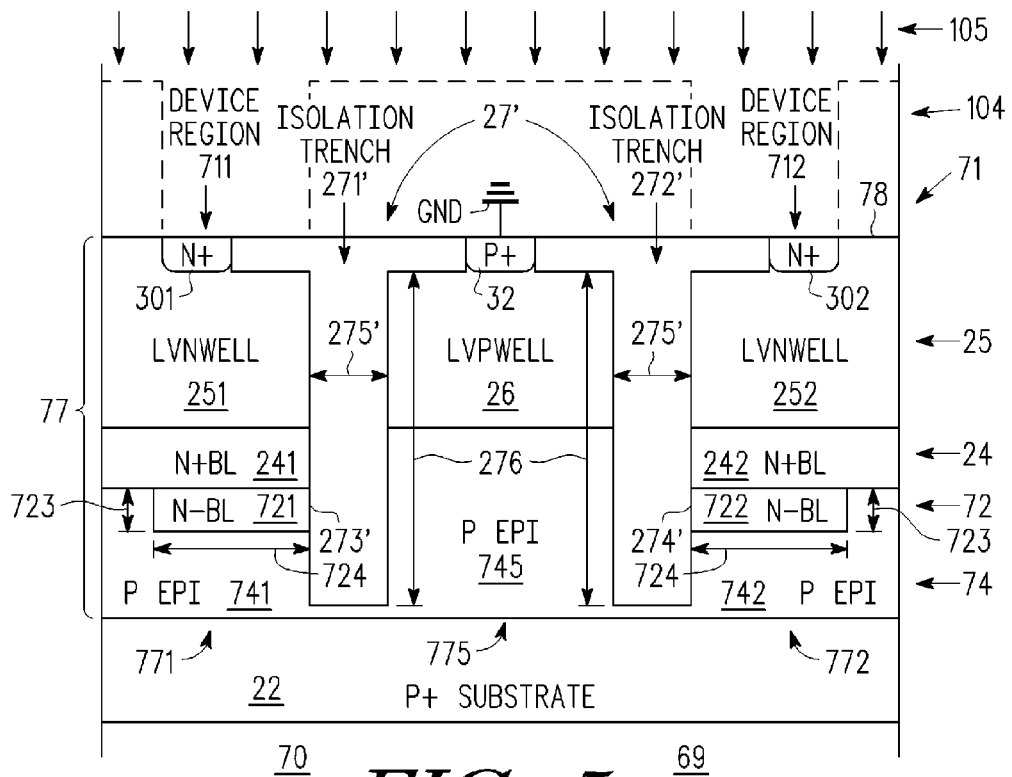
FIG. 5 is a simplified schematic cross-sectional view, analogous to that of FIG. 2, of an isolation wall between adjacent semiconductor device regions on the same SC substrate, utilizing two dielectric lined deep isolation trenches without poly-semiconductor cores, but, but according to a yet further embodiment of the invention.

FIG. 5 shows simplified schematic cross-sectional view 69, similar to that of FIG. 2, of isolation wall 70 between adjacent semiconductor device regions 711, 712 (collectively 71) on SC substrate 22, utilizing two dielectric lined deep isolation trenches 271', 272' (collectively 27'), but according to a yet still further embodiment of the invention. N+BL 24, LVWELLS 25, 26 and contact regions 301, 302 and 32 are substantially the same as in FIGS. 1 and 2. Structure 70 of FIG. 5 differs from structure 40 of FIG. 2 in that N–BL 72 of FIG. 5 (analogous to N–BL 42 of FIG. 2) does not extend across device region 711, 712, but is only provided for distances 724 adjacent to sidewalls 273', 274' of trenches 271', 272'. N–BL 72 has portion 721 of length or distance 724 is associated with device region 711 and portion 722 of length or distance 724 is associated with device region 712. For convenience of explanation, lengths 724 of left and right portions 721, 722 are assumed to be the same, but this is not essential. P EPI region 74 of FIG. 5 (analogous to P EPI region 44 of FIG. 2) has portion 741 associated with device region 711 and portions 742 associated with device region 712, where N–BL portions 721, 722 are in contact with N+BL portions 241, 242 respectively. N–BL 72 and P EPI layer 74 desirably have doping levels substantially the same as N–BL 42 and P EPI layer 44 of FIG. 2 and similarly for N+BL 24. Since, it was found that the electric field concentration in the structure of FIG. 1 occurred primarily at sidewalls 273, 274 of trenches 271, 272, that is where the field spreading effect of N–BL regions 72 have their greatest effect and thereby decrease the peak electric field at sidewalls 273', 274' of dielectric lined deep trenches 271', 272' of FIG. 5, even though they do not extend fully across device regions 711, 712. Thus, BVdss of structure 70 of FIG. 5 is also improved compared to that of structure 20 of FIG. 1.

Figure 6:
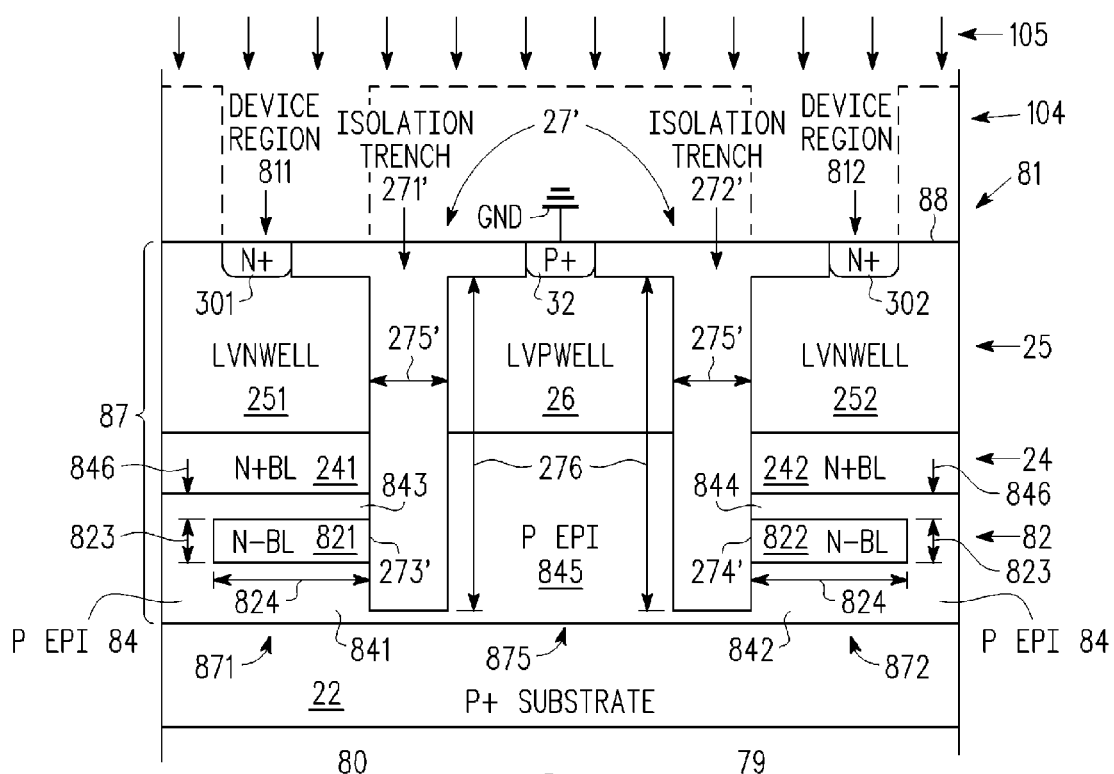
FIG. 6 is a simplified schematic cross-sectional view, analogous to that of FIG. 2, of an isolation wall between adjacent semiconductor device regions on the same SC substrate, utilizing two dielectric lined deep isolation trenches without poly-semiconductor cores, but according to a still yet further embodiment of the invention.

FIG. 6 shows simplified schematic cross-sectional view 79, similar to that of FIG. 2, of isolation wall 80 between adjacent semiconductor device regions 811, 812 (collectively 81) on SC substrate 22, utilizing two dielectric lined deep isolation trenches 271', 272' (collectively 27'), but according to a still yet further embodiment of the invention. N+BL 24, LVWELLS 25, 26 and contact regions 301, 302 and 32 are substantially the same as in FIGS. 1, 2, 4 and 5. Structure 80 of FIG. 6 differs from structure 40 of FIG. 2 in that N–BL 62 analogous to N–BL 42 of FIG. 2 is not in direct contact with N+BL 42 and is limited to distance or length 824 underlying device regions 811, 812. N–BL 82 has portion 821 associated with device region 811 and portion 822 associated with device region 812. P EPI region 84 (analogous to P EPI region 44 of FIG. 2) has portions 841, 843 associated with device region 811 and portions 842, 844 associated with device region 812, where N–BL portion 821 lies between P EPI layer portions 841 and 843 and N–BL portion 822 lies between P EPI layer portions 842 and 844. N+BL 24, N–BL 82 and P EPI layer 84 desirably have doping levels substantially the same as N+BL 24, N–BL 42 and P EPI layer 44 of FIG. 2. Separation distance 846 between N–BL 82 and N+BL 24 is desirably such that regions or portions 843, 844 fully deplete before the breakdown voltage is reached. This has the effect of causing N+BL 24 and N–BL 82 to electrically merge adjacent trench sidewalls 273', 274' so that the combined action is similar to that of the structure of FIG. 2, where N+BL region 24 and analogous N–BL region 42 are in contact. The applied voltage is spread across a greater extent of N–BL 82 and P EPI region 84, thereby decreasing the peak electric field at sidewalls 273', 274' of dielectric lined deep trenches 271', 272'. Since, it was found that the electric field concentration in the structure of FIG. 1 occurred primarily at sidewalls 273, 274 of trenches 271, 272, which is where the field spreading influence of N–BL regions 82 has its greatest effect. Accordingly, the peak electric field at sidewalls 273', 274' of dielectric lined deep trenches 271', 272' is decreased even though N–BL regions 82 do not extend fully across device regions 811, 812. Thus, BVdss of structure 80 of FIG. 6 is also improved compared to that of structure 20 of FIG. 1.

The doping density of N–BL regions 42, 62, 72, 82, 42" of FIGS. 2, 4-8 should have doping concentration intermediate between the doping level of N+BL 24 and underlying P EPI regions 44, 64, 74, 84, 44". Assuming the doping levels for N+BL 24 and P EPI regions 44, 64, 74, 84, 44" described earlier, N–BL 42, 62, 72, 82, 42" desirably has a doping concentration in the range of about 1E16 to 5E16 atoms/cc. To state is another way, N–BL 42, 62, 72, 82, 42" desirably has a doping density less than the doping density of N+BL 24 by a ratio usefully in the range of about 2E2 to 1E4, conveniently in the range of about 5E2 to 5E3 and preferably about 1E3 to 2E3. It is also desirable that N–BL 42, 62, 72, 82, 42" has a doping concentration about 5E0 to 5E1 times higher than the doping level of P EPI region 44, 64, 74, 84, 44". It is desirable that N–BL 42, 62, 72, 82, 42" usefully has thickness 423, 623, 723, 823, 423" of about 0.2 to 2.0 micro-meters, conveniently about 0.3 to 0.7 micro-meters and preferably about 0.5 micro-meters. It is desirable that dielectric lined deep trenches 27' and 27" extend below N–BL 42, 62, 72, 82, 42" by a distance greater than zero micro-meters, and more conveniently at least about 0.25 micro-meters and preferably at least about 0.5 micro-meters. It is desirable that distances or lengths 724, 824 of N–BL 72, 82 be usefully in the range of about 0.3 to 3.0 micro-meters, more desirably in the range of about 0.4 to 2.5 micro-meters, conveniently in the range of about 0.5 to 2.0 micrometers and preferably at least about 1.0 micro-meters. Ion implantation is a preferred technique for providing N–BL regions 42, 62, 72, 82, 42". The energy of the implants should be adjusted so that N–BL regions 42, 62, 72, 82, 42" have a substantial portion lying beneath N+BL regions 24. It is not necessary that the peak concentration of N–BL regions 42, 62, 72, 82, 42" lie below N+BL regions 24, only that there be an appreciable tail of N–BL regions 42, 62, 72, 82, 42" extending below N+BL region 24 so that there is a more gradual doping transition from N+BL 24 to P EPI regions 44, 64, 74, 84, 44". Further, while N+BL region 24 and N–BL regions may be provided through separate implant steps, that is not essential. Alternatively, a single implant step may be utilized wherein N+BL region 24 and N–BL region 42, 62, 42" are formed in a continuous implant during which the dose and energy are varied to produce an N+BL region at a first depth (e.g., corresponding to N+BL region 24) and an N–BL region at a slightly greater depth and lower dose (e.g., corresponding to N–BL region 42, 62, 42"). The same mask, as for example, mask 102 of FIGS. 2 and 4 may be used for both implants 103. Where the lateral extent of N–BL regions 72, 82 does not underlie all of device regions 71, 81, then mask 104 such as is illustrated in FIGS. 5 and 6 may be used with implant 105 for N–BL regions 72, 82. While ion implantation is a preferred means of providing the doped regions described herein, this is not intended to be limiting and other doping techniques well known in the art may also be used to provide such regions, with appropriate adjustment in the fabrication sequence.

Figure 7:
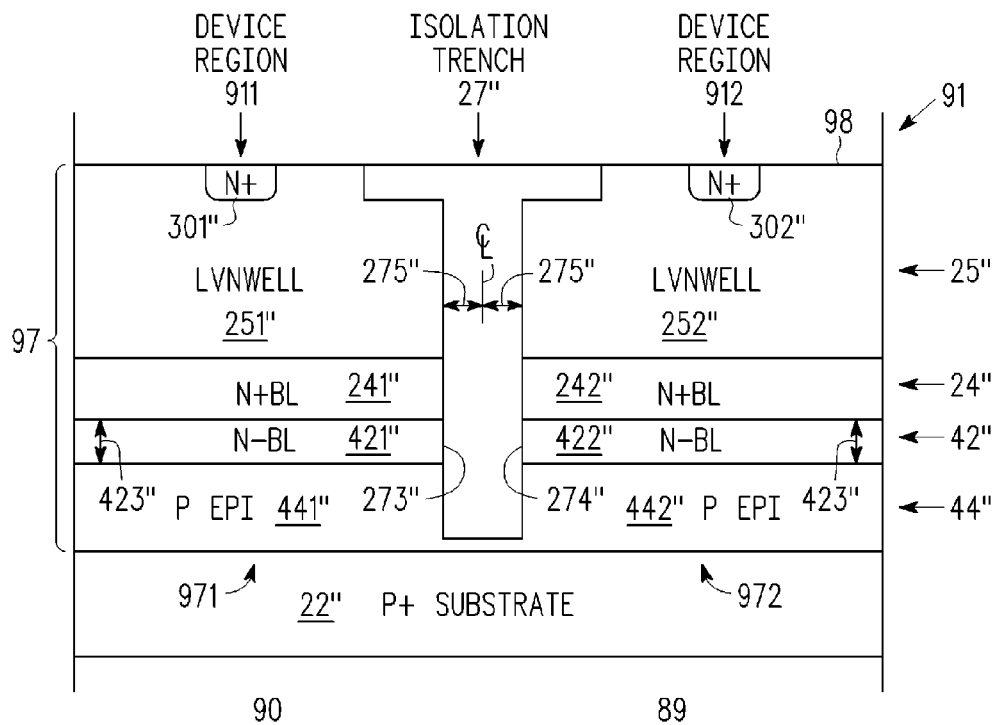
FIG. 7 is a simplified schematic cross-sectional view, analogous to that of FIG. 2, of an isolation wall between adjacent semiconductor device regions on the same SC substrate, utilizing a single dielectric lined deep isolation trench, but according to another embodiment of the invention.
Figure 8:
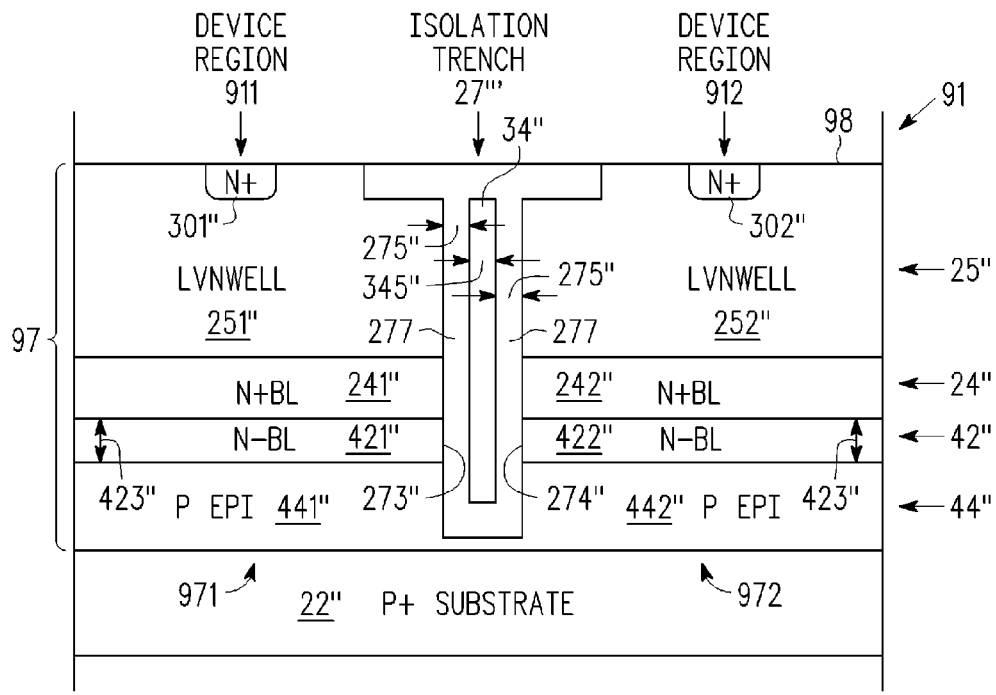
FIG. 8 is a simplified schematic cross-sectional view, analogous to that of FIG. 2, of an isolation wall between adjacent semiconductor device regions on the same SC substrate, utilizing a single dielectric lined deep isolation trench with a floating poly-semiconductor core, according to yet another embodiment of the invention.

FIGS. 7-8 are simplified schematic cross-sectional view 89, 89', analogous to that of FIG. 2, of isolation wall 90, 90' between adjacent semiconductor device regions 911, 912 (collectively 91) on SC substrate 22", utilizing a single dielectric lined deep isolation trench 27", 27'", but according to additional embodiments of the invention, wherein in FIG. 8 poly-SC core 34" analogous to poly-SC core 34 of FIGS. 1-2 is included in single dielectric lined trench 27'" and in trench 27" of FIG. 7 it is omitted. In FIGS. 7-8 the convention is used of identifying the various regions using the same reference numbers as in FIG. 2, but with a double prime (") added. For example, P EPI regions 44" and 441", 442" of FIGS. 7-8 are analogous to regions 44 and 441, 442 of FIG. 2; regions 42", 421", 422" of FIGS. 7-8 are analogous to regions 42, 441, 442 of FIG. 2 and so forth. The same applies to various thicknesses 275", 345", 423" and other reference numbers therein. Unless specifically noted, the dimensions, doping levels, doping ratios, etc., are substantially the same as in FIG. 2. What is different is that part 475 of further SC layer 47 of FIG. 2 has been omitted, and in FIGS. 7-8, only part 971 for device region 911 and part 972 for device region 912 of further SC layer 97 are included. Also, portions 271, 272 of isolation trench 27 of FIG. 2 have been collapsed into single dielectric lined deep isolation trench 27", 27'" of FIGS. 7-8, without a poly-SC core in trench 27" and with floating poly-SC core 34" in trench 27'". The term "floating" as used herein in reference to cores 34, 34" means that such cores are electrically isolated, that is, not connected to some predetermined potential, although that is not precluded. The structure of FIGS. 7-8 is formed, for example, by epitaxially depositing further SC layer 97 on substrate 22", with: (i) part 971 of further SC layer 97 adapted to include P-EPI region 441", N–BL region 421", N+BL region 241" LVNWELL region 251" and contact region 301" at surface 98 of device region 911, and (ii) with part 972 of further SC layer 97 adapted to include P-EPI region 442", N–BL region 422", N+BL region 242" LVNWELL region 252" and contact region 30" at surface 98 of device region 912. Dielectric lined deep isolation trench 27" is formed without a poly-SC core (FIG. 7) and dielectric lined deep isolation trench 27'" is formed with poly core 34", as has been previously described. In trench 27", dimension 275" is the half-width of the dielectric in the trench. In trench 27'", dimension 345" is the lateral width or thickness of poly-SC core 34" and dimension 275" is the lateral width or thicknesses of dielectric lining 277, analogous to unprimed or single primed regions of the same reference numbers described in connection with FIGS. 1-2, and 4-6. P EPI regions 44", N–BL 42", N+BL 24" and LVNWELL 25" of semiconductor parts 971, 972 of further SC layer 97 abut sidewalls 273", 274", respectively, of trenches 27", 27'".

While FIGS. 7-8 illustrate the arrangement wherein N–BL 42" extends substantially under device regions 91 and in contact with N+BL 24", this is not essential and persons of skill in the art will understand based on the description herein, that the arrangements of FIGS. 4-6 may be applied to the structures of FIGS. 7-8, with or without floating cores 34". For example, N–BL 42" may be spaced apart from N+BL 24" in the same manner as in FIG. 4 and/or N–BL 42" may be of limited lateral extent but in contact with sidewalls 273", 274" of trenches 27", 27'", analogous to N-BLs 72 and 82 of FIGS. 5-6. Stated another way, any of the configurations of device regions 41, 61, 71, 81 of FIGS. 2 and 4-6 may be carried over to device regions 91 of FIGS. 7-8, whereby intermediately doped N–BL regions 42, 62, 72, 82 of pre-determined lateral extent are in contact with dielectric lined trench 27, 27' and interposed between N+BL regions 24, 24' and underlying P-EPI regions 44, 64, 74, 84, there by forming isolation walls 90, 90' of FIGS. 7-8.

Persons of skill in the art will appreciate based on the description herein that the embodiments illustrated in FIGS. 2, and 4-8 wherein the breakdown voltage between device regions 411, 412; 611, 612; 711, 712; 811, 812; and 911, 912 and substrate 22 is enhanced has great applicability to semiconductor devices and integrated circuits, especially to semiconductor devices used for power amplifiers and other breakdown voltage sensitive applications that are formed in one or more regions such as device regions 411, 412; 611, 612; 711, 712; 811, 812; and 911, 912, where collector breakdown voltage or equivalent is of major concern. Thus, the increase in breakdown voltage enabled by the present invention has great utility and practical value in enhancing the performance of semiconductor devices and integrated circuits where deep dielectric lined isolation trenches or walls are used to separate regions (e.g., regions 411, 412; 611, 612; 711, 712; 811, 812; and 911, 912.) where power devices and other voltage breakdown sensitive devices are formed.

According to a first embodiment, there is provided an integrated electronic circuit (IC) embodying an isolation wall (40, 60, 70, 80, 90, 90'), comprising, a semiconductor (SC) substrate (22, 22") of a first conductivity type and substrate doping concentration, a further semiconductor (SC) layer (47, 67, 77, 87, 97) overlying the substrate (22, 22") and having an upper surface (48, 68, 78, 88, 98), wherein the further SC layer (47, 67, 77, 87, 97) comprises a first region (44, 64, 74, 84, 44") of the first conductivity type and a first doping concentration less than the substrate doping concentration overlying the substrate (22, 22"), a second region (42, 62, 72, 82, 42") of a second, opposite, conductivity type and a second doping concentration overlying the first region (44, 64, 74, 84, 44"), a third region (24, 24") of the second conductivity type and third doping concentration higher than the second doping concentration overlying the second region (42, 62, 72, 82, 42"), and a fourth region (25, 25") of the second conductivity type and fourth dopant concentration less than the third doping concentration overlying the third region (24, 24") and extending substantially to at least a part of the upper surface (48, 68, 78, 88, 98), and a dielectric lined isolation trench (27, 27', 27") extending from the upper surface (48, 68, 78, 88, 98) through the fourth (25, 25"), third (24, 24"), second (42, 62, 72, 82, 42") and part of the first (44, 64, 74, 84, 44") regions toward the substrate (22, 22"). According to a further embodiment, a sidewall (273, 274; 273', 274', 273", 274") of the dielectric lined isolation trench (27, 27', 27") is in contact with the fourth (25, 25"), third (24, 24"), second (42, 62, 72, 82, 42") and part of the first (44, 64, 74, 84, 44") regions. According to a still further embodiment, the dielectric lined isolation trench (27, 27') has two portions (271, 271; 271', 272'), a left portion (271, 271') and a right portion (272, 272'), with a part (475, 675, 775, 875) of the further SC layer (47, 67, 77, 87) in between the two portions (271, 271; 271', 272'), and wherein the part (475, 675, 775, 875) of the further SC layer (47, 67, 77, 87) in between the two portions (271, 271; 271', 272' has the same doping type as the substrate (22) and makes Ohmic contact thereto. According to a yet further embodiment, the further SC layer (47, 67, 77, 87) has a left device region (411, 611, 711, 811) and a right device region (412, 612, 712, 812), the left device region (411, 611, 711, 811) contacting a left surface (273, 273') of the left portion (271, 271') of the dielectric lined isolation trench (27, 27') and the right portion (412, 612, 712, 812) contacting a right surface (274, 274') of the right portion (272, 272') of the dielectric lined isolation trench (27, 27'). According to a still yet further embodiment, the doping concentration of the third region (24) is $C_{(3)}$ atoms/cc and the doping concentration of the second region (42, 62, 72, 82, 42") is $C_{(2)}$ atoms/cc and the ratio $C_{(3)}/C_{(2)}$ is in the range of about 2E2 to 1E4. According to a yet still further embodiment, the ratio $C_{(3)}/C_{(2)}$ is in the range of about 5E2 to 5E3. According to another embodiment, the doping concentration of the first region (44, 64, 74, 84, 44") is $C_{(1)}$ atoms/cc and the doping concentration of the second region (42, 62, 72, 82, 42") is $C_{(2)}$ atoms/cc and the ratio $C_{(2)}/C_{(1)}$ is in the range of about 5E0 to 5E1. According to a still another embodiment, the third region (24) and the second region (42, 72, 42") are in contact. According to a yet another embodiment, the first region (64, 84) has two portions (641, 643; 642, 644; 841, 842, 843, 844), a first portion (641, 642, 841, 842) underlying the second region (62, 82) and a second portion (643, 644, 843, 844) lying between the second (62, 82) and third (24) regions. According to a still yet another embodiment, the second portion (643, 644; 843 844) has a thickness (646, 846) such that the second portion (643, 644; 843 844) is fully depleted of mobile carriers at a voltage less than or equal to a breakdown voltage between the third region and the substrate.

According to a second embodiment, there is provided an electronic device comprising, a semiconductor body having a substrate layer (22, 22") and a further layer (47, 67, 77, 87, 97) extending from the substrate layer to a first surface (48, 68, 78, 88, 98) spaced apart from the substrate layer (22, 22'), a dielectric lined isolation trench (27, 27', 27", 27''') in the semiconductor body extending from the first surface (48, 68, 78, 88, 98) toward the substrate layer (22, 22) and dividing the further layer (47, 67, 77, 87, 97) into at least two regions (471, 472; 671, 672; 771, 772, 871, 872; 971, 972), a first region (471, 671, 771, 871, 971) on a first side (273, 273', 273") of the dielectric lined isolation trench (27, 27', 27", 27''') and a second region (472, 672, 772, 872, 972) on a second side (274, 274', 274", 274''') of the dielectric lined isolation trench (27, 27', 27", 27'''), wherein at least one of the first (471, 671, 771, 871, 971) and second (472, 672, 772, 872, 972) regions has first (44, 44", 64, 74, 84) second (42, 42", 62, 72, 82), third (24, 24") and fourth (25, 25") portions abutting one of the first (273, 273', 273") or second (274, 274', 274", 274''') sides of the dielectric lined isolation trench (27, 27', 27", 27'''), and wherein the first portion (44, 44", 64, 74, 84) of a first conductivity type and first dopant concentration C1 overlies the substrate layer (22, 22"), the second portion (42, 42", 62, 72, 82) of a second, opposite conductivity type and second dopant concentration C2 overlies at least part of the first portion (44, 44", 64, 74, 84), the third portion (24, 24") of the second conductivity type and a third dopant concentration C3 overlies the second portion (42, 42", 62, 72, 82), and the fourth portion (25, 25") of the second conductivity type and a fourth dopant concentration C4 overlies the third portion (24, 24"); and wherein C1<C2<C3>C4. According to a further embodiment, the dielectric lined isolation trench (27, 27'''), has a polycrystalline semiconductor core (34, 34"). According to a still further embodiment, the dielectric lined isolation trench (27, 27'), has first (271, 271') and second (272, 272') separated parts, wherein a left side (273, 273') of the first part (271, 271') abuts the first semiconductor region (471, 761, 771, 871) and a right side (274, 274') of the second part abuts the second semiconductor region (472, 672, 772, 872), and a third region (475, 675, 775, 875) of the further layer (47, 67, 77, 87) lies between the first (271, 271') and second (272, 272') separated parts of the dielectric lined isolation trench (27, 27'). According to a yet further embodiment, both parts (271, 272) of the dielectric lined isolation trench (27) have a polycrystalline semiconductor core (34). According to a still yet further embodiment, the second portion (72, 82) extends laterally from the one of the first (273') or second (274') sides of the dielectric lined isolation trench (27') for a distance (724, 824) smaller than a lateral extent of the first (74, 84) or third (24) portion.

According to a third embodiment, there is provided a semiconductor device, comprising, a semiconductor body having a substrate layer (22), 22") and a further layer (47, 67, 77, 87, 97) extending from the substrate layer (22, 22') to a first surface (48, 68, 78, 88, 98) of the semiconductor body, a dielectric lined isolation trench (27, 27', 27") extending into the semiconductor body from the first surface (48, 68, 78, 88, 98) so that at least one dielectric lined sidewall (273, 274, 273', 274' 273", 274") is in contact with stacked portions (44, 42, 24, 25; 64, 62; 74, 72; 84, 82; 44", 42") of the further layer (47, 67, 77, 87, 97), and wherein a first portion (44, 44", 64, 74, 84) of the further layer (47, 67, 77, 87, 97) has a first dopant concentration C1, a second overlying portion (42, 42", 62, 72, 82) of the further layer (47, 67, 77, 87, 97) has a second dopant concentration C2, and a third overlying portion (24, 24") of the further layer (47, 67, 77, 87, 97) has a third dopant concentration C3, such that C1<C2<C3 and that C1 and C2 are of opposite conductivity type and C2 and C3 are of the same conductivity type. According to a further embodiment, the further layer (47, 67, 77, 87, 97) comprises a fourth overlying portion (25, 25") of dopant concentration C4 such that C4<C3 and C4 and C3 are of the same conductivity type. According to a still further embodiment, the second portion (72, 82) extends laterally from the at least one dielectric sidewall (273', 274') for a predetermined distance (724, 824) D2 and the third portion (24) extends laterally from the at least one dielectric sidewall (273', 274') for a predetermined distance D3, such that D2<D3. According to a yet further embodiment, D2 is in the range of about 0.3 to about 3.0 micrometers. According to a still yet further embodiment, the dielectric lined isolation trench (27, 27') comprises two parts (271, 272; 271', 272') separated by another part (475, 675, 775, 875) of the further layer (47, 67, 77, 87) ohmically coupled to the substrate layer (22).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An integrated electronic circuit (IC) embodying an isolation wall, comprising:
    a semiconductor (SC) substrate of a first conductivity type and substrate doping concentration;
    a further semiconductor (SC) layer overlying the substrate and having an upper surface, wherein the further SC layer comprises a first region of the first conductivity type and a first doping concentration less than the substrate doping concentration overlying the substrate, a second region of a second, opposite, conductivity type and a second doping concentration overlying the first region, a third region of the second conductivity type and third doping concentration higher than the second doping concentration overlying the second region, and a fourth region of the second conductivity type and fourth dopant concentration less than the third doping concentration overlying the third region and extending substantially to at least a part of the upper surface; and
    a dielectric lined isolation trench extending from the upper surface through the fourth, third, second and part of the first regions toward the substrate.

2. The circuit of claim 1, wherein a sidewall of the dielectric lined isolation trench is in contact with the fourth, third, second and part of the first regions.

3. The circuit of claim 2, wherein the dielectric lined isolation trench has two portions, a left portion and a right portion, with a part of the further SC layer in between the two portions, and wherein the part of the further SC layer in between the two portions has the same doping type as the substrate and makes Ohmic contact thereto.

4. The circuit of claim 3, wherein the further SC layer has a left device region and a right device region, the left device region contacting a left surface of the left portion of the dielectric lined isolation trench and the right portion contacting a right surface of the right portion of the dielectric lined isolation trench.

5. The circuit of claim 1, wherein the doping concentration of the third region is $C_{(3)}$ atoms/cc and the doping concentration of the second region is $C_{(2)}$ atoms/cc and the ratio $C_{(3)}/C_{(2)}$ is in the range of about 2E2 to 1E4.

6. The circuit of claim 5, wherein the ratio $C_{(3)}/C_{(2)}$ is in the range of about 5E2 to 5E3.

7. The circuit of claim 1, wherein the doping concentration of the first region is $C_{(1)}$ atoms/cc and the doping concentration of the second region is $C_{(2)}$ atoms/cc and the ratio $C_{(2)}/C_{(1)}$ is in the range of about 5E0 to 5E1.

8. The circuit of claim 1, wherein the third region and the second region are in contact.

9. The circuit of claim 1, wherein the first region has two portions a first portion underlying the second region and a second portion lying between the second and third regions.

10. The circuit of claim 9, wherein the second portion has a thickness such that the second portion is fully depleted of mobile carriers at a voltage less than or equal to a breakdown voltage between the third region and the substrate.

11. An electronic device comprising:
    a semiconductor body having a substrate layer and a further layer extending from the substrate layer to a first surface spaced apart from the substrate layer;
    a dielectric lined isolation trench in the semiconductor body extending from the first surface toward the substrate layer and dividing the further layer into at least two regions, a first region on a first side of the dielectric lined isolation trench and a second region on a second side of the dielectric lined isolation trench;
    wherein at least one of the first and second regions has first, second, third and fourth portions abutting one of the first or second sides of the dielectric lined isolation trench; and
    wherein the first portion of a first conductivity type and first dopant concentration C1 overlies the substrate layer, the second portion of a second, opposite conductivity type and second dopant concentration C2 overlies at least part of the first portion, the third portion of the second conductivity type and a third dopant concentration C3 overlies the second portion, and the fourth portion of the second conductivity type and a fourth dopant concentration C4 overlies the third portion; and wherein C1<C2<C3>C4.

12. The device of claim 11, wherein the dielectric lined isolation trench has a polycrystalline semiconductor core.

13. The device of claim 11, wherein the dielectric lined isolation trench has first and second separated parts, wherein a left side of the first part abuts the first semiconductor region and a right side of the second part abuts the second semiconductor region, and a third region of the further layer lies between the first and second separated parts of the dielectric lined isolation trench.

14. The device of claim 13, wherein both parts of the dielectric lined isolation trench have a polycrystalline semiconductor core.

15. The device of claim 11, wherein the second portion extends laterally from the one of the first or second sides of the dielectric lined isolation trench for a distance smaller than a lateral extent of the first or third portion.

16. A semiconductor device, comprising:
    a semiconductor body having a substrate layer and a further layer extending from the substrate layer to a first surface of the semiconductor body;
    a dielectric lined isolation trench extending into the semiconductor body from the first surface so that at least one dielectric lined sidewall is in contact with stacked portions of the further layer; and
    wherein a first portion of the further layer has a first dopant concentration C1, a second overlying portion of the further layer has a second dopant concentration C2, and a third overlying portion of the further layer has a third dopant concentration C3, such that C1<C2<C3 and that C1 and C2 are of opposite conductivity type and C2 and C3 are of the same conductivity type.

17. The semiconductor device of claim 16, wherein the further layer comprises a fourth overlying portion of dopant concentration C4 such that C4<C3 and C4 and C3 are of the same conductivity type.

18. The semiconductor device of claim 17, wherein the second portion extends laterally from the at least one dielectric sidewall for a predetermined distance D2 and the third portion extends laterally from the at least one dielectric sidewall for a predetermined distance D3, such that D2<D3.

19. The semiconductor device of claim 18 wherein D2 is in the range of about 0.3 to about 3.0 micrometers.

20. The semiconductor device of claim 16 wherein the dielectric lined isolation trench comprises two parts separated by another part of the further layer ohmically coupled to the substrate layer.

* * * * *